United States Patent
Fan et al.

(10) Patent No.: US 12,537,544 B2
(45) Date of Patent: Jan. 27, 2026

(54) LOW-POWER BLOCK CODE FORWARD ERROR CORRECTION DECODER

(71) Applicant: Maxlinear, Inc., Carlsbad, CA (US)

(72) Inventors: Youzhe Fan, Carlsbad, CA (US); Jining Duan, Carlsbad, CA (US)

(73) Assignee: Maxlinear, Inc., Carlsbad, CA (US)

( * ) Notice: Subject to any disclaimer, the term of this patent is extended or adjusted under 35 U.S.C. 154(b) by 15 days.

(21) Appl. No.: 18/461,361

(22) Filed: Sep. 5, 2023

(65) Prior Publication Data

US 2023/0412196 A1  Dec. 21, 2023

Related U.S. Application Data

(63) Continuation of application No. 16/367,538, filed on Mar. 28, 2019, now Pat. No. 11,750,223.

(60) Provisional application No. 62/648,965, filed on Mar. 28, 2018.

(51) Int. Cl.
| | |
|---|---|
| *H03M 13/15* | (2006.01) |
| *H03M 13/00* | (2006.01) |
| *H03M 13/11* | (2006.01) |

(52) U.S. Cl.
CPC ... *H03M 13/1545* (2013.01); *H03M 13/1105* (2013.01); *H03M 13/157* (2013.01); *H03M 13/6561* (2013.01)

(58) Field of Classification Search
CPC ......... H03M 13/1545; H03M 13/1105; H03M 13/157; H03M 13/6561; H03M 13/1525; H03M 13/1585; H03M 13/159
See application file for complete search history.

(56) References Cited

U.S. PATENT DOCUMENTS

| | | | | |
|---|---|---|---|---|
| 4,665,523 | A | * 5/1987 | Citron | H03M 13/151 714/785 |
| 5,323,402 | A | * 6/1994 | Vaccaro | H03M 13/151 714/751 |
| 5,901,158 | A | 5/1999 | Weng et al. | |
| 5,936,972 | A | * 8/1999 | Meidan | H04L 1/20 370/333 |
| 6,061,768 | A | 5/2000 | Kuo et al. | |

(Continued)

OTHER PUBLICATIONS

Jian Liang, R. Tessier and D. Goeckel, "A dynamically-reconfigurable, power-efficient turbo decoder," 12th Annual IEEE Symposium on Field-Programmable Custom Computing Machines, Napa, CA, USA, 2004.*

(Continued)

*Primary Examiner* — Steve N Nguyen
(74) *Attorney, Agent, or Firm* — Buchalter; Jason W. Croft

(57) ABSTRACT

A system comprises a forward error correction decoder comprising syndrome computation circuitry, key-equation solver circuitry, and search and evaluator circuitry. The syndrome computation circuitry may comprise a plurality of syndrome compute units connected in parallel. The syndrome computation circuitry may be dynamically configurable to vary a quantity of the syndrome compute units used for processing of a codeword based on conditions of a channel over which the codeword was received. The syndrome computation circuitry may be operable to use a first quantity of the syndrome compute units for processing of a first codeword received over the channel when the channel is characterized by a first bit error rate and a second quantity of the syndrome compute units for processing of a second codeword received over the channel when the channel is characterized by a second bit error rate.

20 Claims, 8 Drawing Sheets

(56) References Cited

U.S. PATENT DOCUMENTS

| | | | |
|---|---|---|---|
| 6,470,471 | B1 | 10/2002 | Noguchi |
| 7,870,468 | B1* | 1/2011 | Vanka ................. H03M 13/155 714/784 |
| 8,301,987 | B2 | 10/2012 | Dror et al. |
| 8,327,242 | B1 | 12/2012 | Anholt et al. |
| 9,166,623 | B1 | 10/2015 | Bates et al. |
| 11,750,223 | B2 | 9/2023 | Fan et al. |
| 2003/0101406 | A1 | 5/2003 | Song |
| 2003/0229842 | A1 | 12/2003 | Lee et al. |
| 2004/0177312 | A1 | 9/2004 | Xin |
| 2006/0048037 | A1* | 3/2006 | Solomon ........... H03M 13/6513 714/792 |
| 2008/0195913 | A1* | 8/2008 | Bates ................ H03M 13/1105 714/752 |
| 2012/0079236 | A1* | 3/2012 | Suvakovic .......... G06F 15/7867 712/30 |
| 2014/0108883 | A1* | 4/2014 | Tehrani .............. H03M 13/1108 714/E11.031 |
| 2014/0136931 | A1 | 5/2014 | Nakamura et al. |
| 2018/0034481 | A1 | 2/2018 | Garani et al. |
| 2018/0157551 | A1 | 6/2018 | Ryabinin et al. |
| 2018/0159555 | A1* | 6/2018 | Ryabinin .......... H03M 13/3715 |
| 2019/0305800 | A1 | 10/2019 | Fan et al. |

OTHER PUBLICATIONS

Sarwate, Dilip V. et al., High-Speed Architectures for Reed-Solomon Decoders, IEEE Transactions on Very Large Scale integration (VLSI) Systems, vol. 9, No. 5, Oct. 2001, pp. 641-655.

Park, J.I. et al.,Area-efficient truncated Berlekamp-Massey Architecture for Reed-Solomon Decoder, Electronics Letters Feb. 17, 2011 vol. 47 No. 4.

Reed, I.S et al., VLSI Design of Inverse-Free Berlekamp-Massey Algorithm, IEE Pproceedings-E, vol. 138, No. 5, Sep. 1991 pp. 295-298.

Ying Cui, Xiao Peng, Yu Jin, Peil in Liu, S. Kimura and S. Goto, "High-parallel LDPC decoder with power gating design," 2011 9th IEEE International Conference on ASIC, 2011.

Hsie-Chia Chang, Chien-Ching Lin and Chen-Yi Lee, "A low-power Reed-Solomon decoder for STM-16 optical communications," Proceedings. IEEE Asia-Pacific Conference on ASIC,, Taipei, Taiwan, 2002.

B. R. Surabhi, S. N. Nampoothiri and P. Jayakrishnan, "Design of area efficient and low power reed solomon decoder," 2016 International Conference on Control, Instrumentation, Communication and Computational Technologies (ICCICCT), Kumaracoil, 2016.

J. Kessels, "VLSI programming of a low-power asynchronous Reed-Solomon decoder for the DCC player," Proceedings Second Working Conference on Asynchronous Design Methodologies, London, UK, 1995.

R. Huynh, N. Ge and H. Yang, "A low power error detection in the syndrome calculator block for reed-solomon codes: RS(204, 188)," in Tsinghua Science and Technology, vol. 14, No. 4, pp. 474-477, Aug. 2009.

X. Zhang, I. Dror and S. Alterman, "Low-power partial-parallel Chien search architecture with polynomial degree reduction," 2016 IEEE International Symposium on Circuits and Systems (ISCAS), Montreal, QC, 2016.

\* cited by examiner

LOW-POWER BLOCK CODE FORWARD ERROR CORRECTION DECODER

PRIORITY CLAIM

This application is a continuation of U.S. application Ser. No. 16/367,538 titled "LOW-POWER BLOCK CODE FORWARD ERROR CORRECTION DECODER" filed on Mar. 28, 2019, which claims priority to United State Provisional application 62/648,965 titled "Low-Power Block Code Forward Error Correction Decoder" filed on Mar. 28, 2018, each of which is hereby incorporated herein by reference in their entireties.

BACKGROUND

Conventional systems and methods for forward error correction decoding can be overly power hungry, slow, expensive, and inflexible. Further limitations and disadvantages of conventional and traditional approaches will become apparent to one of skill in the art, through comparison of such systems with some aspects of the present invention as set forth in the remainder of the present application with reference to the drawings.

BRIEF SUMMARY

Provided are systems and methods for low-power block code forward error correction decoder, substantially as shown in and/or described in connection with at least one of the figures, as set forth more completely in the claims.

Advantages, aspects and novel features of the present disclosure, as well as details of various implementations thereof, will be more fully understood from the following description and drawings.

DETAILED DESCRIPTION OF THE INVENTION

Figure 1A:
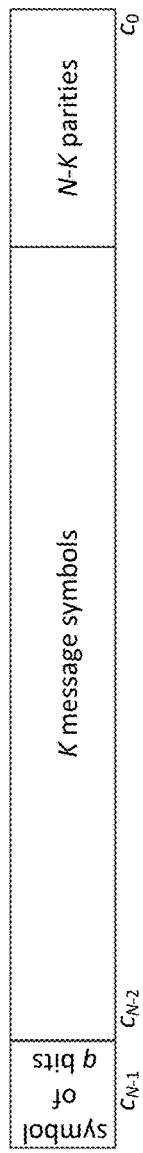
FIG. 1A shows an example structure of a forward error correction (FEC) codeword which a low-power FEC decoder in accordance with an example implementation of this disclosure is operable to decode.

FIG. 1A shows an example structure of a forward error correction (FEC) codeword which a low-power FEC decoder in accordance with an example implementation of this disclosure is operable to decode. Each codeword comprises N (an integer) symbols, $C_0$-$C_{N-1}$, each of which has q (an integer) bits. K of the symbols are message symbols and N−K (N minus K) of the symbols are parity symbols. The shown codeword structure supports correction of up to t=(N−K)/2 symbols. Example block codes include Reed-Solomon codes, BCH codes, Reed-Muller codes, etc.

Figure 1B:
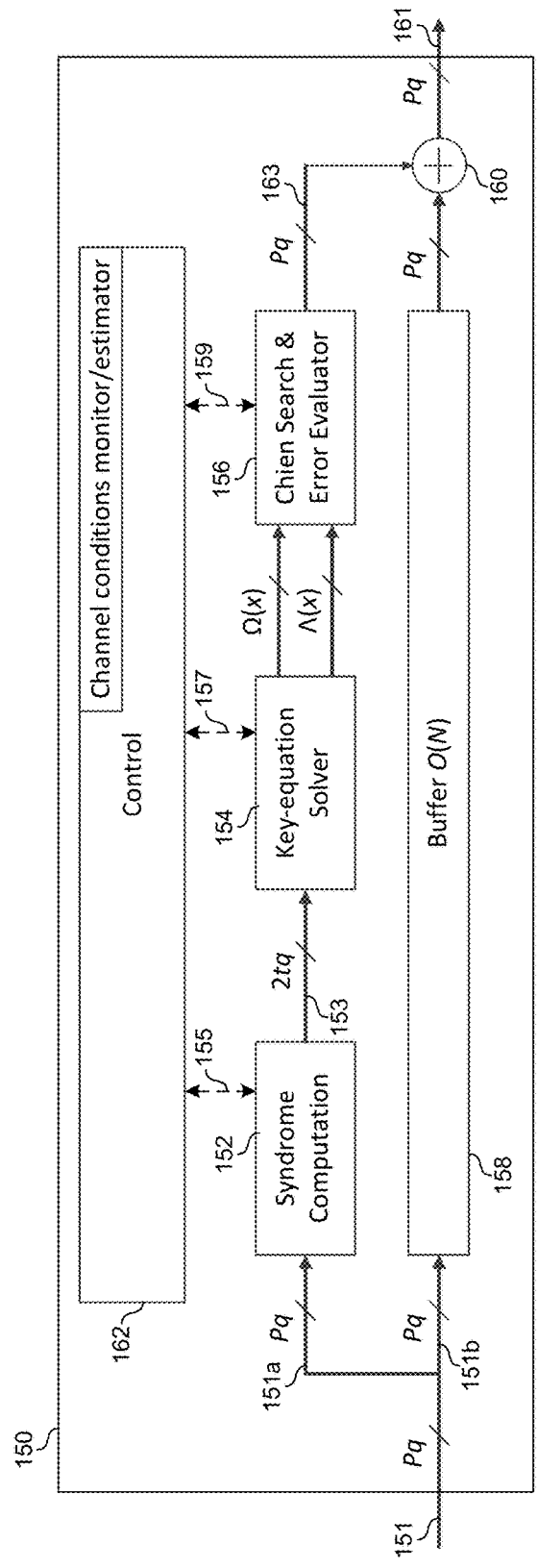
FIG. 1B shows the architecture of a low-power FEC decoder in accordance with an example implementation of this disclosure.

FIG. 1B shows the architecture of a low-power FEC decoder 150 in accordance with an example implementation of this disclosure. The received codewords 151 are fed into two parallel paths 151a and 151b, each of the 151a and 151b being Pq (P "times" q) bits wide (P an integer). The first path comprises syndrome computation circuitry 152, key-equation solver circuitry 154, and Chien Search and Error Evaluator circuitry 156. The second path comprises a buffer 158 that introduces a delay equal to the delay of the first path. The outputs of the two paths are then combined in combiner 160 to result in an error corrected signal 161.

The control circuitry 162 is operable to manage operations of the other circuits of the FEC decoder 150 as described below in this disclosure. The control circuitry 162 may, for example, comprise logic that operates according to software and/or firmware loaded into memory of the control circuitry 162.

An example implementation of the syndrome computation circuit 152 is described below with reference to FIG. 2. An example implementation of the key-equation solver circuitry 154 is described below with reference to FIGS. 3A-3C. An example implementation of the Chien search and error evaluator 156 is described below with reference to FIGS. 4A and 4B. The buffer 158 may comprise any suitable volatile and/or nonvolatile memory elements.

Figure 2:
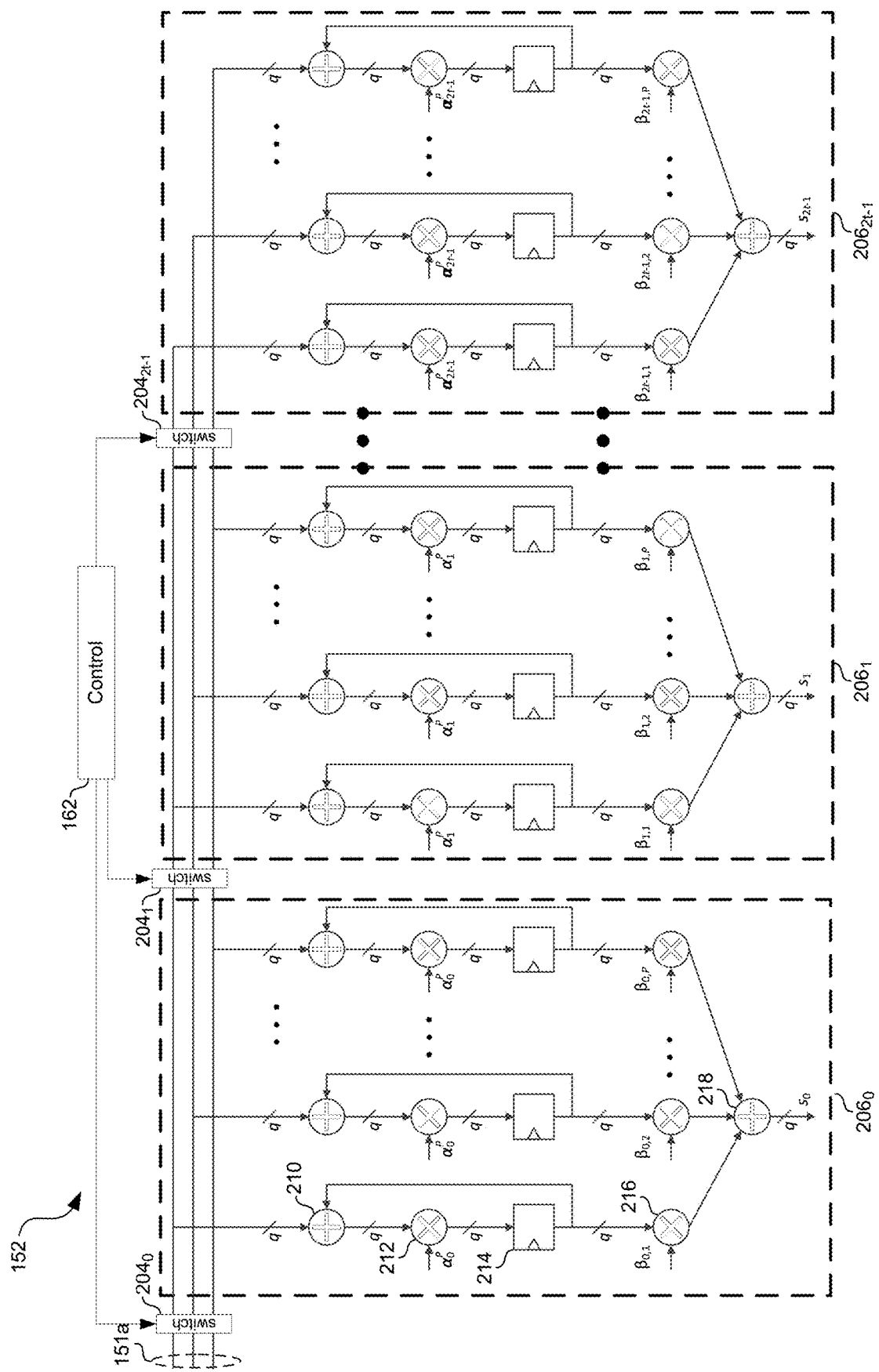
FIG. 2 shows an example implementation of the syndrome computation circuitry of FIG. 1B.

FIG. 2 shows an example implementation of the syndrome computation circuitry of FIG. 1B. The example syndrome computation circuitry 152 comprises control circuitry 162, switches $204_0$-$204_{2t-1}$, and a plurality of syndrome compute units $206_0$-$206_{2t-1}$.

The control circuitry 162 may be operable to detect channel conditions present on a channel over which the codewords are received, and control the switches based on the detected channel conditions, as further described below. The control circuitry 162 in FIG. 1B is also operable to measure a block error rate at the output of the Syndrome Computation 152, based on which a bit error rate of the coded bits input to the low-power FEC decoder 150 is calculated. Control information is exchanged between the control circuitry 162 and the circuits 152, 154, and 156 via signals 155, 157, and 159.

The switches $204_0$-$204_{2t-1}$ may comprise transmission gates or any other suitable circuit operable to connect and disconnect (or enable and disable) a downstream one or more of circuits $206_0$-$206_{2t-1}$ from the signal path 151a.

Each of the syndrome compute units $206_T$ (T between 0 and 2t−1) comprises P processing chains, each comprising an adder 210, a first multiplier 212, a memory element 214, and a second multiplier 216. The outputs of the processing chains are then summed in adder 218 to generate syndromes $S_T$ according to equation 1 below.

The syndrome computation circuitry 152 is operable to calculate 2t syndromes $S_0$-$S_{2t-1}$ for each codeword, according to the following equation 1:

$$\begin{bmatrix} s_0 \\ s_1 \\ \vdots \\ s_{2t-1} \end{bmatrix} = \begin{bmatrix} \alpha_0^{N-1} & \alpha_0^{N-2} & \cdots & 1 \\ \alpha_1^{N-1} & \alpha_1^{N-2} & \cdots & 1 \\ \vdots & \vdots & \vdots & \vdots \\ \alpha_{2t-1}^{N-1} & \alpha_{2t-1}^{N-2} & \cdots & 1 \end{bmatrix} \begin{bmatrix} C_{N-1} \\ C_{N-2} \\ \vdots \\ C_0 \end{bmatrix}$$

where $\alpha_0=\alpha^w$, $\alpha_1=\alpha^{w+1}$, ... $\alpha_{2t-1}=\alpha^{w+2t-1}$ are the powers of a primitive root $\alpha$, and w is a given integer. If all syndromes are 0, then the codeword is error free, otherwise the codeword has one or more error symbols. The value of t is typically determined at the encoder based on the worst-case channel conditions for which the FEC decoder 150 is expected to reliably decode codewords. Thus, in a conventional FEC decoder, a fixed number of 2t syndromes are computed. Power consumption, however, increases with increasing values of t. Thus, when channel conditions are better than the worst-case and the FEC decoder is able to reliably decode codewords with a smaller number of syndromes, computing 2t syndromes burns unnecessary power. It is therefore desirable from a power consumption perspective to compute the minimum number of syndromes necessary for the current channel conditions. Because the syndrome computation is independent for each syndrome (that is, each of circuits $206_0$-$206_{2t-1}$ can independently compute its respective one of the syndromes), the FEC decoder 150 may use only a subset of circuits $206_0$-$206_{2t-1}$ to compute syndromes for any given codeword. That is, for a codeword received over channel conditions which only require computation of 2m syndromes (where m is an integer less than or equal to t), control circuitry 162 may open switches $204_{2m}$-$204_{2t-1}$ to disconnect or disable the unneeded circuits $206_{2m}$-$206_{2t-1}$ such that circuits $206_{2m}$-$206_{2t-1}$ do not compute syndromes for that codeword—and thus burn less power.

Figure 3A:
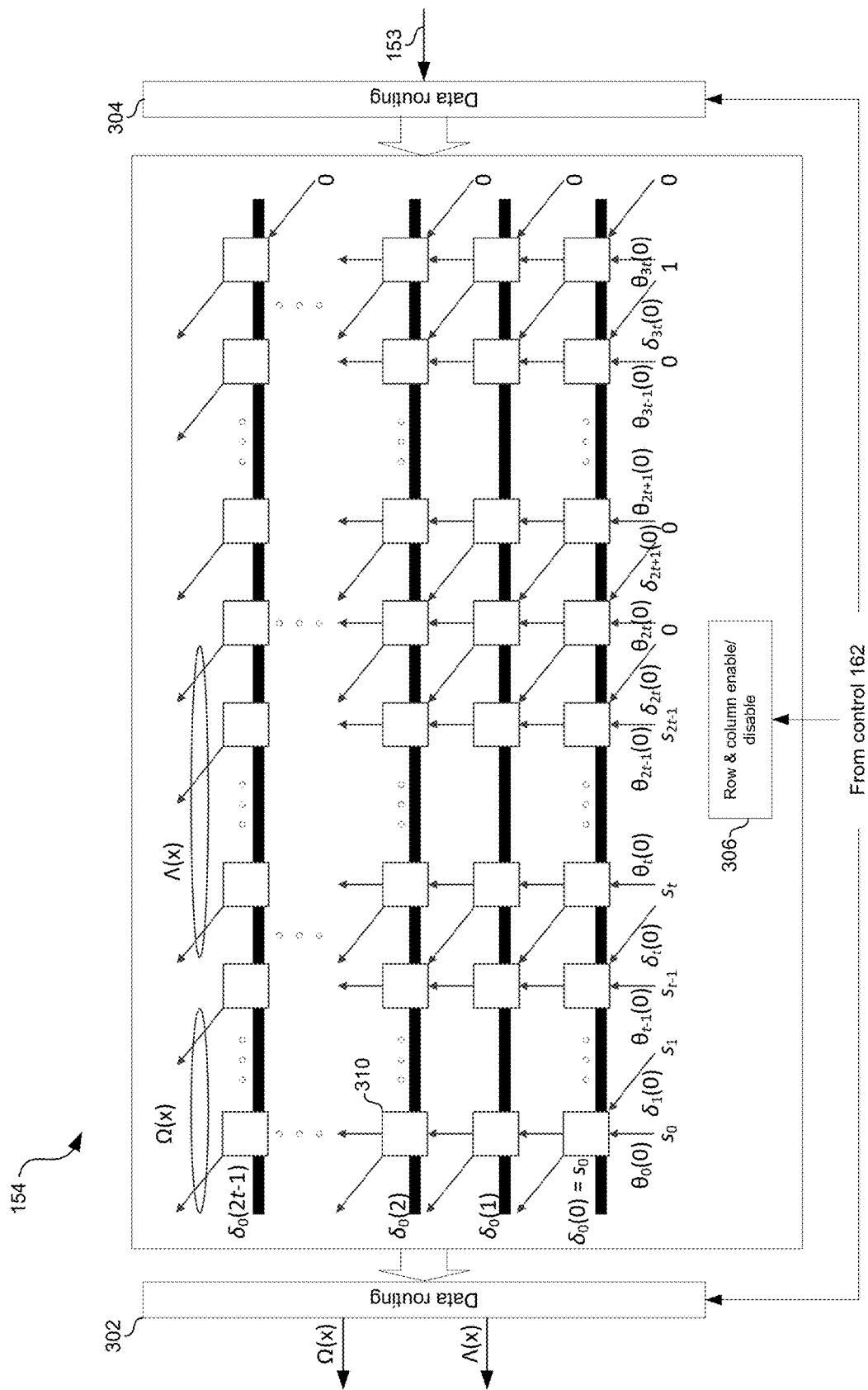
FIG. 3A shows an example implementation of key-equation solver circuitry of FIG. 1B.

FIG. 3A shows an overview of key-equation solver circuitry of FIG. 1B. In the example implementation shown, the key-equation solver circuitry 154 is implemented as a systolic array of processing elements 310 (of which only one is called out in FIG. 3A) arranged in 2t rows and 3t+1 columns. The data in the systolic array flows row by row from the bottom to the top. At row r (r between 0 and 2t−1), 3t+1 elements of $\delta_i(r+1)$ and $\theta_1(r+1)$ are generated from $\delta_i(r)$, $\delta_0(r)$ at the previous row, where i between 0 and 3t is the column index of the array from the left to the right. As a result, at the last row, the systolic array finds out the error locator polynomial $\Lambda(x)=\lambda_t x^t+\lambda_{t-1}x^{t-1}+\ldots+\lambda_0$ and the error evaluator polynomial $\Omega(x)=\omega_{t-1}x^{t-1}+\omega_{t-2}x^{t-2}+\ldots+\omega_0$ by having $\lambda_i=\delta_{i+t}(2r)$ for i between 0 and t and $\omega_i=\delta_i(2r)$ for i between 0 and t−1. The error locator polynomial is used to find the locations of error symbols, and the error evaluator polynomial is used to calculate the value of the error symbol. In an example implementation, the processing elements in the systolic array may be implemented on hardware that is time-shared, thus reducing the amount of hardware needed to realize the key-equation solver circuitry 154. In addition to the processing elements 310, the key-equation solver circuitry 154 comprises data routing circuitry 302 and 304, and row and column enable/disable circuitry 306.

Which portion of the processing elements 310 in the array are enabled for any particular codeword is controlled by control circuitry 162 via row and column enable/disable circuitry 306. For a codeword received over a channel requiring computation of m syndromes, 2m rows and 3m+1 columns of the key-equation solver are enabled to generate an error locator polynomial $\Lambda(x)$ of degree m, and an error evaluator polynomial $\Omega(x)$ of degree m−1. Thus, where m is less than t, one or more processing elements 310 remain in an inactive or low power state and power consumption of the key-equation solver circuitry 154 is reduced as compared to calculating an error locator polynomial of degree t and an error evaluator polynomial of degree t−1.

The data routing circuitry 304 is operable to route syndromes $S_0$-$S_{2m-1}$ from bus 153 to inputs of processing elements 310 in columns 0 through 2m−1 of the array, so that $\delta_i(0)=\theta_i(0)$ $S_i$ for i between 0 and 2t−1.

The data routing circuitry 302 is operable to route: (1) signal $\delta(x)$ from columns 0 through m−1 of row 2m; and (2) $\Lambda(x)$ from columns m through 2m of the row 2m to the Chien search and evaluator circuitry 156.

Figure 3C:
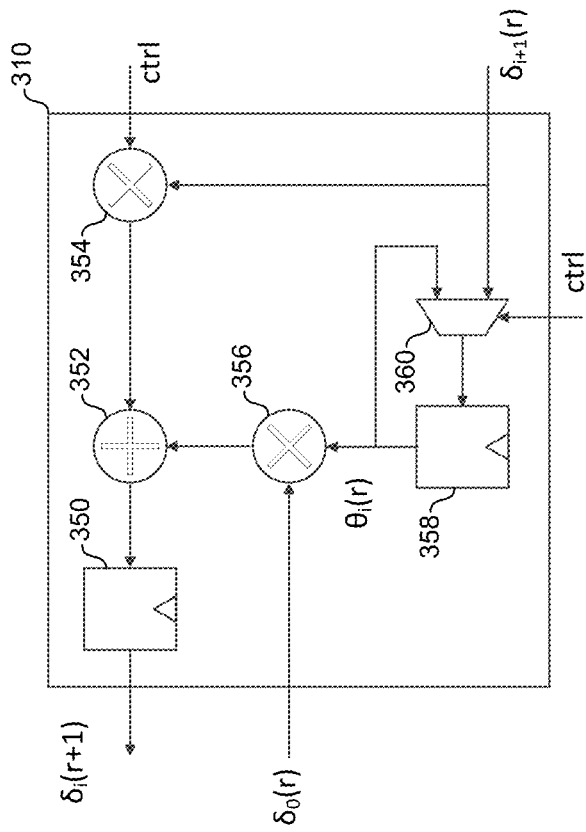
FIG. 3C shows an example implementation of the processing elements of the key-equation solver of FIG. 3A.
Figure 3B:
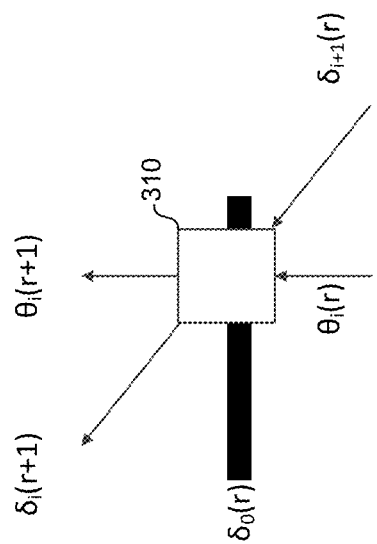
FIG. 3B shows a zoomed-in view of one of the processing elements of the key-equation solver of FIG. 3A.

FIG. 3B shows a zoomed-in view of one of the processing elements of the key-equation solver of FIG. 3A with the input and output signals detailed.

FIG. 3C shows an example implementation of the processing elements of the key-equation solver of FIG. 3A.

Figure 4A:
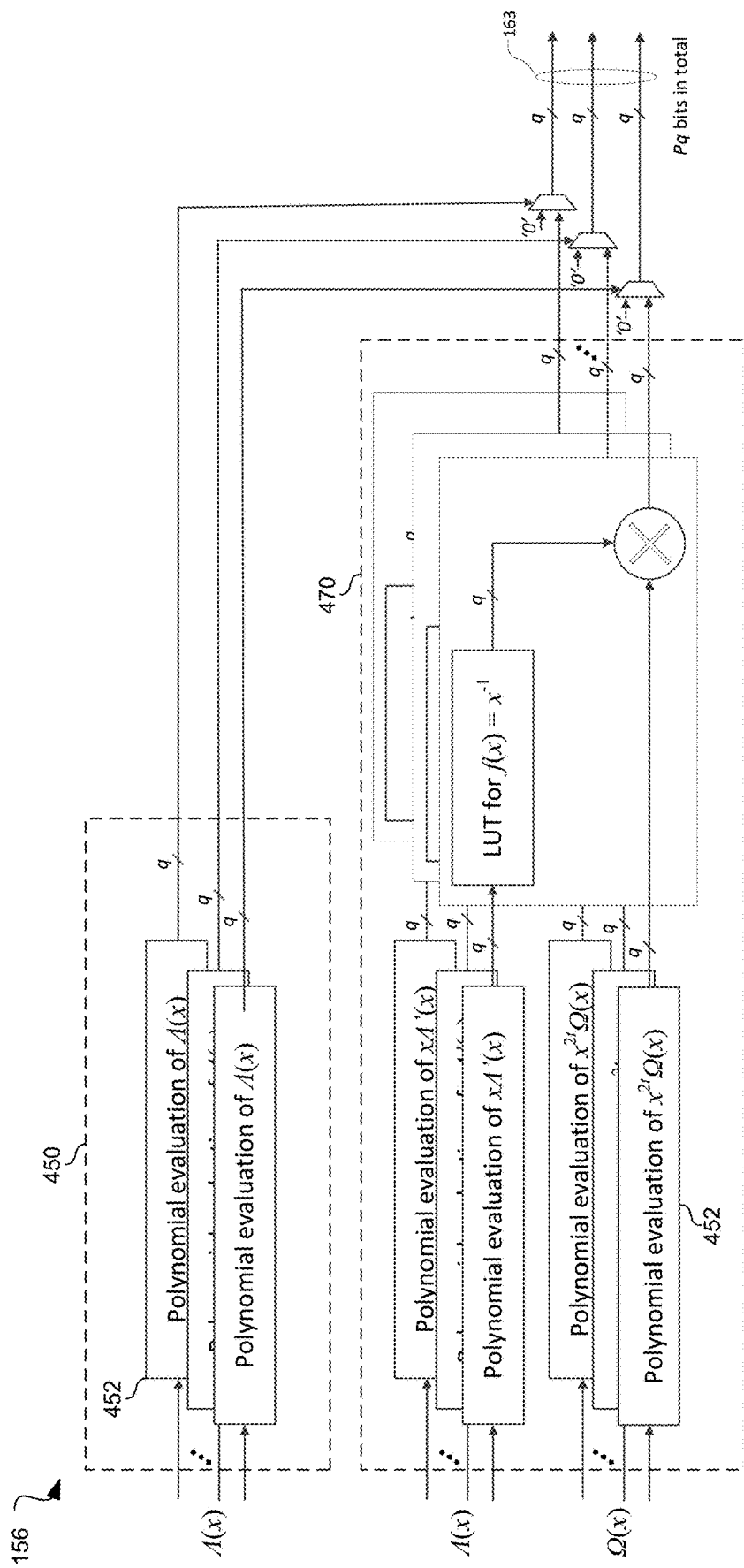
FIG. 4A shows an example implementation of the Chien search and error evaluator circuitry of FIG. 1B.

FIG. 4A shows an example implementation of the Chien search and error evaluator circuitry of FIG. 1B. The Chien search circuitry 450 evaluates the error locator polynomial $\Lambda(x)$ at $x=\alpha^{-i}$ for i between N−1 and 0. If $\Lambda(\alpha^{-i})=0$, $C_i$ is a symbol with error. The error value is given by $x^{2t}\Omega(x)/x/\Lambda'(x)$ for $x=\alpha^{-i}$, which is calculated by the error evaluator circuitry 470. Each polynomial evaluation circuit 452 (of which only 2 are called out in the figure) processes a symbol of q bits each time. To detect and correct Pq bits each time in the low-power FEC decoder, P data paths are instantiated in each of the Chien search circuitry 450 and the error evaluator circuitry 470.

Figure 4B:
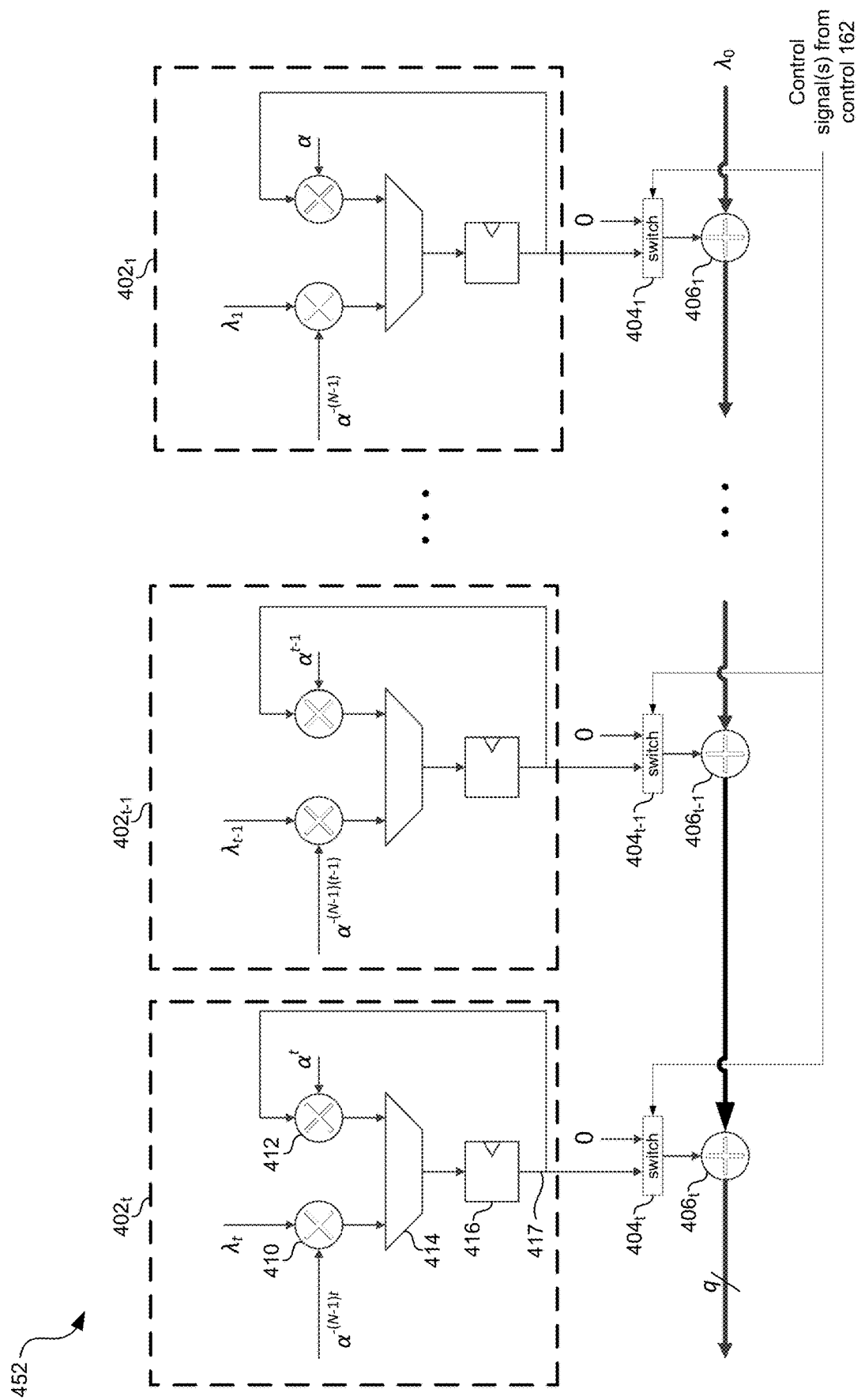
FIG. 4B shows an example implementation of the polynomial evaluation circuitry of FIG. 4A.

Now referring to FIG. 4B, each polynomial evaluation circuit 452 comprises processing units $402_1$-$402_t$, switches $404_1$-$404_t$, and adders $406_1$-$406_t$.

Each of the processing units $402_1$-$402_t$ comprises multipliers 410 and 412, multiplexer 414, and memory element 416 for generating a signal 417 which is output to a respective one of switches $404_1$-$404_t$.

The switches $404_1$-$404_t$ are operable to switch the input of a respective one of the adders $406_1$-$406_t$ between the output of a corresponding one of circuits $402_1$-$402_t$ and a digital '0' value. When a digital '0' is bypassed, it is equivalent that the corresponding term $\lambda_r x^r$ is removed from the polynomial $\Lambda(x)$.

The equation for calculating $\Lambda(x)$ can be written as $\lambda_t x^t+\lambda_{t-1}x^{t-1}+\ldots+\lambda_1 x+\lambda_0$. Thus, computation for each degree term is independent and a polynomial evaluator architecture such as shown in FIG. 4B can be used. Where m (the number of syndromes) is less than t, the control circuitry 162 may disconnect or disable circuits $402_{m+1}$-$402_t$ via switches $404_{m+1}$-$404_t$, resulting in reduced power consumption (the circuits $402_{m+1}$-$402_t$ may be placed in a low-power state to further reduce power consumption). Given that the similar polynomial evaluator architecture shown in FIG. 4B can be used in each data path of polynomial evaluation for error evaluator circuitry 470, where m (the number of syndromes) is less than t, the control circuitry 162 may disconnect or disable the similar circuits $402_{m+1}$-$402_t$ in error evaluator circuitry for reduced power consumption.

Figure 5:
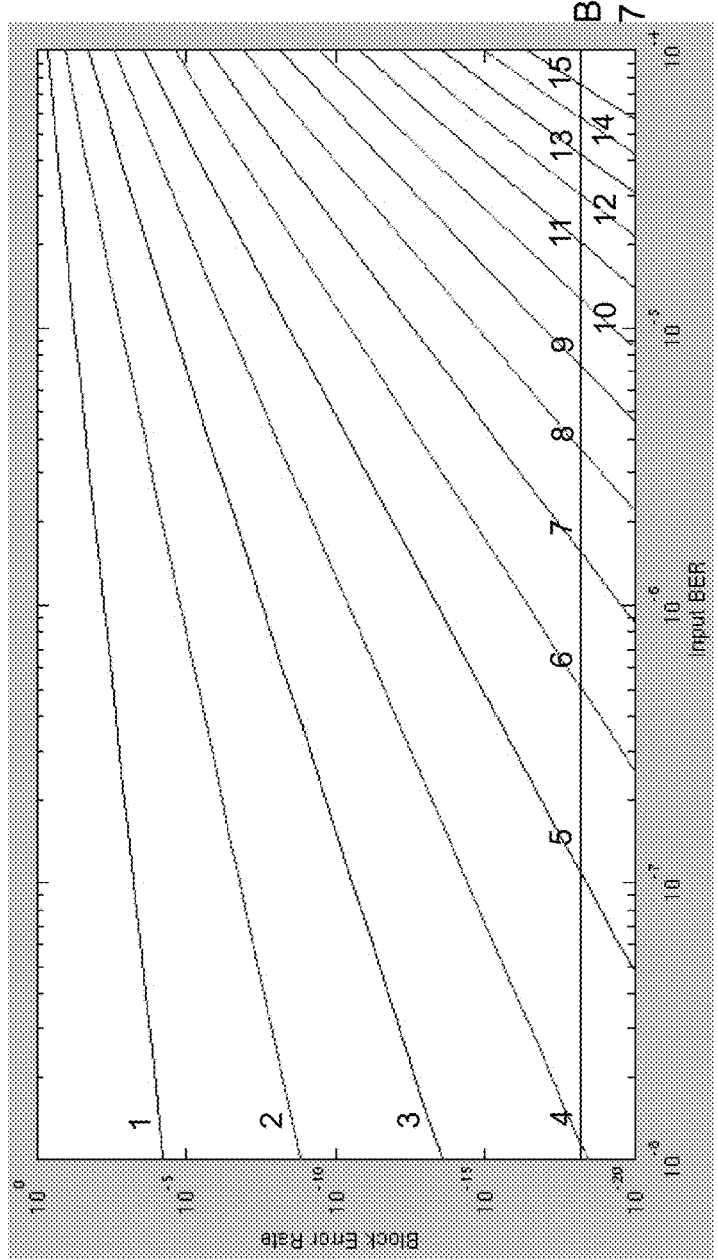
FIG. 5 illustrates that the number of syndromes needed to achieve a target block error rate (BLER) decreases when the bit error rate (BER) on the coded bits decreases.

FIG. 5 shows the relationship between the block error rate (BLER) of the codeword after the FEC decoding and the bit error rate (BER) of the coded bits input to the decoder when different number of syndromes 2m are computed for decoding, for an example Reed-Solomon code with N=544, K=514 and q=10. From the figure, it can be seen that when the BER of coded bits decreases, fewer syndromes need to be computed in the FEC decoder to achieve a same target block error rate (BLER). For example, the worst-case channel in this experiment has a coded BER of 7.5e−5 and t=15 has been designed at the encoder to achieve the target BLER. When the input BER is better than the worst-case for which the FEC is designed, however, m can be set to a value less than 15 to save power and still achieve the desired BLER (e.g., m=10 for BER~1e-5, m=7 for BER~1e-6, and m=5 for BER~1e-7).

Figure 6:
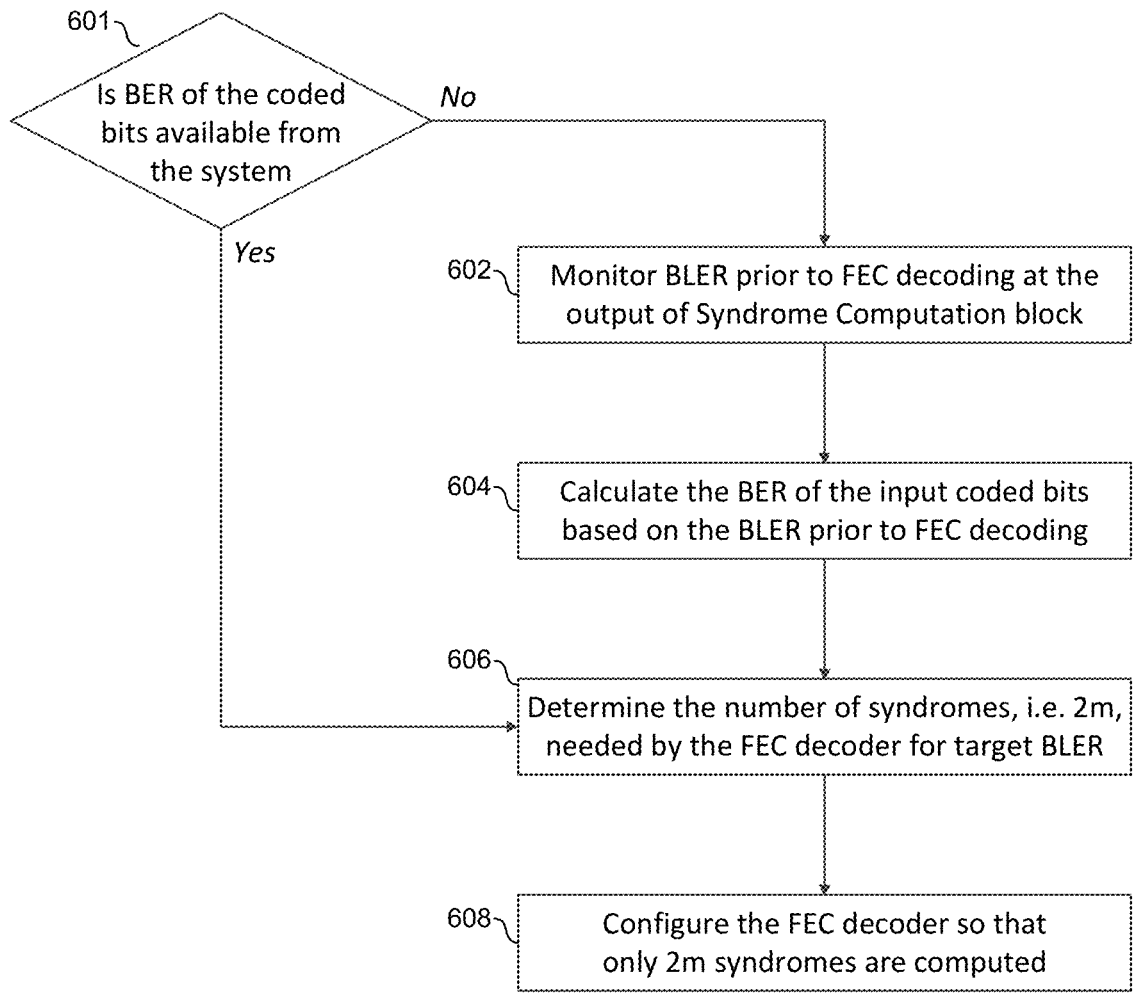
FIG. 6 is a flowchart showing an example process for adapting a low-power FEC decoder in accordance with an example implementation of this disclosure.

FIG. 6 is a flowchart showing an example process for adapting a low-power FEC decoder in accordance with an example implementation of this disclosure. The process begins with block 601. If the BER of the input coded bits is not available from the system outside the FEC decoder, it is estimated in blocks 602 and 604. If the BER is available from outside the FEC decoder, then the process advances to block 606.

In block 602, the block error rate (BLER) of the codeword prior to the error correction is monitored at the output of the syndrome computation circuitry 152. A codeword is error free if and only if all the syndromes are zero. This may comprise, for example, measuring the BLER over multiple codewords and then taking an average of the measured BLER values.

In block 604, the BER of the input coded bits is calculated (e.g., by control circuitry 162) from the block error rate determined in block 602, based upon the FEC parameters, e.g. N and q.

In block 606, with the BER of the input coded bits provided by the system outside FEC decoder or estimated inside FEC decoder, the value of m required to meet the target BLER is calculated. For example, the control circuitry 162 may calculate the value of m using a lookup table holding the data similar to that plotted in FIG. 5.

In block 608, the FEC decoder 150 is configured based on the value of m calculated in block 606. For example, the control circuitry 162 may: open one or more of the switches $204_0$-$204_{2t-1}$ to disconnect or disable one or more of the compute units $206_0$-$206_{2t-1}$ from the path 151a, close one or more of the switches $204_0$-$204_{2t-1}$ connect or enable one or more of the compute units $206_0$-$206_{2t-1}$ to the path 151a; disable, via circuit 306, one or more rows and columns of processing elements 310 in the key-equation solver circuitry 154; enable, via circuit 306, one or more rows and columns of processing elements 310 in the key-equation solver circuitry 154; configure one or more of the switches $404_1$-$404_t$ to connect or enable a respective one or more of the adder $406_1$-$406_t$ to an output of a respective one or more of the circuits $402_1$-$402_t$; and/or configure one or more of the switches $404_1$-$404_t$ to connect a respective one or more of the adder $406_1$-$406_t$ to digital '0' value and disconnect or disable a respective one or more of the processing units $402_1$-$402_t$.

In accordance with an example implementation of this disclosure, a system comprises a forward error correction decoder (e.g., 150) comprising syndrome computation circuitry (e.g., 152), key-equation solver circuitry (e.g., 154), and search and evaluator circuitry (e.g., 156). The syndrome computation circuitry may comprise a plurality of syndrome compute units (e.g., $206_0$-$206_{2t-1}$) connected in parallel. The syndrome computation circuitry may be dynamically configurable to vary a quantity of the syndrome compute units used for processing of a codeword based on conditions of a channel over which the codeword was received. Each of the syndrome compute units may comprise a plurality of adders (e.g., 210 and 218), a plurality of multipliers (e.g., 212 and 216), and a plurality of memory elements (e.g., 214). The syndrome computation circuitry may be operable to use a first quantity of the syndrome compute units (e.g., 2t) for processing of a first codeword received over the channel when the channel is characterized by a first bit error rate and a second quantity of the syndrome compute units (e.g., 2m) for processing of a second codeword received over the channel when the channel is characterized by a second bit error rate, where the first quantity of syndrome compute units is greater than the second quantity of syndrome compute units and the first bit error rate is greater than the second bit error rate. The key-equation solver circuitry may comprise an array of processing elements (e.g., 310). The key-equation solver circuitry may be dynamically configurable to vary a quantity of the processing elements of the key-equation solver circuitry used for processing of a codeword based on conditions of a channel over which the codeword was received. Each of the processing elements of the key-equation solver circuitry may comprise a plurality of multipliers (e.g., 354 and 356), one or more adder (e.g., 352), a plurality of memory elements (e.g., 350 and 358), and one or more multiplexers (e.g., 360). The key-equation solver circuitry may be operable to use a first quantity (e.g., $2t*(3t+1)$) of the processing elements for processing of a first codeword received over the channel when the channel is characterized by a first bit error rate and a second quantity (e.g., $2m*(3m+1)$) of the processing elements for processing of a second codeword received over the channel when the channel is characterized by a second bit error rate, the first quantity of the processing elements of the key-equation solver circuitry may be greater than the second quantity of the processing elements of the key-equation solver circuitry, and the first bit error rate may be greater than the second bit error rate. The search and evaluator circuitry may comprise a plurality of processing units (e.g., 402) connected in parallel. The search and evaluator circuitry may be dynamically configurable to vary a quantity of the processing units of the search and evaluator circuitry used for processing of a codeword based on conditions of a channel over which the codeword was received. Each of the processing units of the search and evaluator circuitry may comprise a plurality of multipliers (e.g., 410 and 412), one or more multiplexer (e.g., 414), and one or more memory element (e.g., 416). The search and evaluator circuitry is operable to use a first quantity (e.g., t) of the processing units for processing of a first codeword received over the channel when the channel is characterized by a first bit error rate and a second quantity of the processing units (e.g., m) for processing of a second codeword received over the channel when the channel is characterized by a second bit error rate, the first quantity of the processing units of the search and evaluator circuitry is greater than the second quantity of the processing units of the search and evaluator circuitry, and the first bit error rate is greater than the second bit error rate.

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set {(x), (y), (x, y)}. As another example, "x, y, and/or z" means any element of the seven-element set {(x), (y), (z), (x, y), (x, z), (y, z), (x, y, z)}. As utilized herein, the term "exemplary" means serving as a non-limiting example, instance, or illustration. As utilized herein, the terms "e.g.," and "for example" set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled, or not enabled, by some user-configurable setting.

Other embodiments of the invention may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the methods described herein.

Accordingly, the present invention may be realized in hardware, software, or a combination of hardware and software. The present invention may be realized in a centralized fashion in at least one computing system, or in a distributed fashion where different elements are spread across several interconnected computing systems. Any kind of computing system or other apparatus adapted for carrying out the methods described herein is suited. A typical combination of hardware and software may be a general-purpose computing system with a program or other code that, when being loaded and executed, controls the computing system such that it carries out the methods described herein. Another typical implementation may comprise an application specific integrated circuit or chip.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A system comprising:
a forward error correction decoder comprising syndrome computation circuitry, key-equation solver circuitry, and search and evaluator circuitry, wherein:
the key-equation solver circuitry comprises an array of processing elements arranged in columns and rows, and
the key-equation solver circuitry is dynamically configurable to vary a first number of the rows and a second number of the columns in the array of processing elements to decode a codeword based on:
a third number of syndromes associated with the codeword to be computed, wherein the first number is greater than or equal to twice the third number, and
conditions of a channel over which the codeword was received.

2. The system of claim 1, wherein:
the syndrome computation circuitry comprises a plurality of syndrome compute units connected in parallel; and
each of the syndrome compute units comprises a plurality of adders, a plurality of multipliers, and a plurality of memory elements.

3. The system of claim 1, wherein:
the syndrome computation circuitry is operable to use a first quantity of the processing elements for processing of a first codeword received over the channel when the channel is characterized by a first bit error rate and a second quantity of the processing elements for processing of a second codeword received over the channel when the channel is characterized by a second bit error rate; and
the first quantity of the processing elements is greater than the second quantity of the processing elements and the first bit error rate is greater than the second bit error rate.

4. The system of claim 1, each of the processing elements of the key-equation solver circuitry comprises a plurality of multipliers, one or more adder, one or more memory elements, and one or more multiplexers.

5. The system of claim 1, wherein:
the search and evaluator circuitry comprises a plurality of processing units connected in parallel; and
the search and evaluator circuitry is dynamically configurable to vary a quantity of the processing units of the search and evaluator circuitry used for processing of a codeword based on conditions of a channel over which the codeword was received.

6. The system of claim 5, wherein each of the processing units of the search and evaluator circuitry comprises a plurality of multipliers, one or more multiplexer, and one or more memory element.

7. The system of claim 5, wherein:
the search and evaluator circuitry is operable to use a first quantity of the processing units for processing of a first codeword received over the channel when the channel is characterized by a first bit error rate and a second quantity of the processing units for processing of a second codeword received over the channel when the channel is characterized by a second bit error rate; and
the first quantity of the processing units of the search and evaluator circuitry is greater than the second quantity of the processing units of the search and evaluator circuitry and the first bit error rate is greater than the second bit error rate.

8. The system of claim 1, wherein the key-equation solver circuitry determines an error locator polynomial to find a location of an error symbol in the codeword and an error evaluator polynomial to calculate a value of the error symbol in the codeword based on the conditions of the channel.

9. The system of claim 1, wherein the second number is equal to one plus three times the third number.

10. The system of claim 1, wherein the processing elements are implemented on time-shared hardware.

11. A method, comprising:
in a forward error correction decoder comprising syndrome computation circuitry, key-equation solver circuitry, and search and evaluator circuitry, wherein the key-equation solver circuitry comprises an array of processing elements arranged in columns and rows:
dynamically determining a quantity of the processing elements and an arrangement of a first number of columns and a second number of rows of the processing elements to use for decoding a codeword, wherein the determining is based on a third number of syndromes associated with the codeword to be computed and conditions of a channel over which the codeword was received, wherein the first number is greater than or equal to twice the third number; and decoding the codeword using the determined quantity of processing elements.

12. The method of claim 11, wherein the syndrome computation circuitry comprises a plurality syndrome compute units that each comprise a plurality of adders, a plurality of multipliers, and a plurality of memory elements.

13. The method of claim 11, wherein:
the codeword is received over the channel when the channel is characterized by a first bit error rate;
the decoding uses a first quantity of syndrome compute units;
a second codeword is received over the channel when the channel is characterized by a second bit error rate;
the method comprises dynamically determining to use a second quantity of syndrome compute units for decoding the second codeword;
the first bit error rate is greater than the second bit error rate;
the first quantity of syndrome compute units is greater than the second quantity of syndrome compute units; and
the method comprises decoding the second codeword using the second quantity of syndrome compute units.

14. The method of claim 11, each of the processing elements of the key-equation solver circuitry comprises a plurality of multipliers, one or more adder, one or more memory elements, and one or more multiplexers.

15. The method of claim 11, wherein:
the search and evaluator circuitry comprises a plurality of processing units connected in parallel; and
the search and evaluator circuitry is dynamically configurable to vary how many of the processing units are used for processing of a codeword based on conditions of a channel over which the codeword was received.

16. The method of claim 15, wherein each of the processing units of the search and evaluator circuitry comprises a plurality of multipliers, one or more multiplexer, and one or more memory element.

17. The method of claim 15, wherein:
the codeword is received over the channel when the channel is characterized by a first bit error rate;
the decoding uses a first quantity of processing units of the search and evaluator circuitry;
a second codeword is received over the channel when the channel is characterized by a second bit error rate;
the method comprises dynamically determining to use a second quantity of processing units of the search and evaluator circuitry for decoding the second codeword;
the first bit error rate is greater than the second bit error rate;
the first quantity of processing units of the search and evaluator circuitry is greater than the second quantity of processing units of the search and evaluator solver circuitry; and
the method comprises decoding the second codeword using the second quantity of processing units of the search and evaluator circuitry.

18. The method of claim 11, further comprising determining an error locator polynomial to find a location of an error symbol in the codeword and an error evaluator polynomial to calculate a value of the error symbol in the codeword based on the conditions of the channel.

19. The method of claim 11, wherein the second number is equal to one plus three times the third number.

20. The method of claim 11, wherein the processing elements are implemented on time-shared hardware.

* * * * *